United States Patent
Chen et al.

(10) Patent No.: US 9,153,323 B2
(45) Date of Patent: *Oct. 6, 2015

(54) SYSTEMS AND METHODS FOR GENERATING SOFT INFORMATION IN NAND FLASH

(71) Applicant: Marvell World Trade Ltd., St. Michael (BB)

(72) Inventors: Zhengang Chen, San Jose, CA (US); Gregory Burd, San Jose, CA (US); Shashi Kiran Chilappagari, San Jose, CA (US); Xueshi Yang, Cupertino, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 14/177,609

(22) Filed: Feb. 11, 2014

(65) Prior Publication Data
US 2014/0160855 A1    Jun. 12, 2014

Related U.S. Application Data

(63) Continuation of application No. 13/477,678, filed on May 22, 2012, now Pat. No. 8,681,564.

(60) Provisional application No. 61/489,108, filed on May 23, 2011.

(51) Int. Cl.
*G11C 16/34*    (2006.01)
*G11C 16/06*    (2006.01)
*G11C 16/26*    (2006.01)
*G11C 11/56*    (2006.01)
*G06F 11/10*    (2006.01)

(52) U.S. Cl.
CPC ............ *G11C 16/06* (2013.01); *G06F 11/1048* (2013.01); *G11C 11/5642* (2013.01); *G11C 16/26* (2013.01); *G11C 16/34* (2013.01); *G11C 16/3427* (2013.01)

(58) Field of Classification Search
CPC ........ G11C 16/06; G11C 16/26; G11C 16/34; G11C 16/3427; G11C 16/0458; G11C 11/5642; G06F 11/1048
USPC .............................. 365/185.2, 185.03, 185.24
See application file for complete search history.

(56) References Cited

U.S. PATENT DOCUMENTS

| | | | |
|---|---|---|---|
| 7,397,697 B2 | 7/2008 | So et al. | |
| 7,535,765 B2 | 5/2009 | Maayan | |
| 7,831,881 B2 | 11/2010 | Eun et al. | |
| 7,889,563 B2 | 2/2011 | Cho et al. | |
| 8,681,564 B2 * | 3/2014 | Chen et al. | .................. 365/185.2 |

* cited by examiner

*Primary Examiner* — Tan T. Nguyen (57) ABSTRACT

Systems and methods are provided to generate soft information related to the threshold voltage of a memory cell. A range of threshold voltages for the memory cell is divided into subregions of threshold voltage values herein referred to as bins. An output of the memory cell in response to an applied reference signal is measured. The applied reference signal includes a voltage value and position information. A single bin is identified based on the position information of the reference signal. The identified bin is split into more than one bin based on the output of the memory cell and the voltage value of the reference signal. The newly split bins and all the other bins that were not split are assigned new bin indices.

20 Claims, 8 Drawing Sheets

SYSTEMS AND METHODS FOR GENERATING SOFT INFORMATION IN NAND FLASH

CROSS REFERENCE TO RELATED APPLICATION

This disclosure is a continuation of U.S. patent application Ser. No. 13/477,678 filed May 22, 2012 (currently allowed), which claims the benefit of U.S. Provisional Application No. 61/489,108, filed May 23, 2011, each of which is hereby incorporated by reference herein in its respective entirety.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, is neither expressly nor impliedly admitted as prior art against the present disclosure.

Memory cells, especially NAND flash memory cells, store bits by storing different amounts of charge in the floating gate of a transistor, and accordingly exhibit different amounts of threshold voltage. Additionally, noise influences the cells containing the same stored bit to have different threshold voltages. Because of these issues, memory cells do not have a fixed threshold voltage, but rather form a distribution of threshold voltages. Current flash memory devices do not provide the capability to directly measure their threshold voltages. However, the inherent threshold voltage of a memory cell is required to be known in order to correctly read the bits stored in these memory cells.

The current methods for determining the soft information of memory cells, an estimate of the inherent threshold voltage of the memory cell, are neither robust nor efficient. Current methods probe a memory cell with a sequence of monotonically increasing or decreasing reference voltages in a multi-pass read. However, if one of the applied reference voltages in such a multi-pass read falls out of the monotonically increasing or decreasing order, then the soft information generation method is corrupted. This corruption occurs because current methods confuse the voltage value of the out of order reference voltage with the voltage value of the expected reference voltage. Such a mistake leads to corruption of the soft information generation method because the measured output of the memory cell is not associated with the correct reference voltage value. In addition, due to read-to-read variation in actual memory devices, which result from measurement inaccuracies and noise affecting the read operation, the measured output from one cell may contradict with a previous read from the same cell. Current methods are not capable of handling such inconsistencies.

SUMMARY

Systems and methods are provided for generating soft information related to the threshold voltage of a memory cell. In particular, these systems and methods are directed to efficiently overcome the inability of current soft information generation methods to deal with read-to-read variation present in memory devices and reference voltages that fall out of a monotonically increasing sequence in a multi-pass read.

In some embodiments, a reference signal is applied to a memory cell and the memory cell's output may be measured. In some implementations, measuring an output of the memory cell may include applying the reference signal to the memory cell, issuing a read command to a memory cell, and reading a stored bit in the memory cell. In some embodiments, the reference signal may include a voltage value and may also include position information.

In some embodiments, several bins divide the range of threshold voltage values of a memory cell. In some embodiments, one of these bins may be identified by the position information of the reference signal. In some embodiments, the identified bin may be split into two or more bins based on the output of the memory cell and the voltage value of the reference signal. In some implementations, the boundary of the split bins may be determined based on the voltage value of the reference signal.

In some embodiments, all the bins may be assigned an index. In some implementations, the newly split bins may be assigned an index based on the measured output of the memory cell. In some implementations, the bins that are not split may also be assigned a new index.

In some implementations, the position information of the reference signal may contain information identifying the relative position of the applied reference signal with respect to all other previously applied reference signals to the memory cell. In another implementation, the position information of the reference signal may include an indication of which bin the reference signal's voltage value corresponds to.

In some embodiments, the reference signal may be transmitted from a reference voltage control unit to a bin index generation unit. The reference voltage control unit may generate the reference signal and the bin index generation unit may split the bins identified by the reference signal.

In some embodiments, an invalid measured output from the memory cell may be detected. Upon detecting such an invalid measured memory output, a new index may be assigned to the bins that are not split independent of the measured output's validity.

In some embodiments, bin indexes may be assigned such that all the bin indices are arranged in a numerically increasing order.

BRIEF DESCRIPTION OF THE DRAWINGS

The above and other objects and advantages of the present disclosure will be apparent upon consideration of the following detailed description, taken in conjunction with the accompanying drawings, in which like reference characters refer to like parts throughout, and in which.

DETAILED DESCRIPTION OF EMBODIMENTS

This disclosure generally relates to generating soft information of the threshold voltage value for a memory cell. For illustrative purposes, this disclosure is described in the context of a solid-state memory device (e.g., a flash memory device). However, it should be understood that the teachings of this disclosure are equally applicable to any other electronic storage system in which it is beneficial for a controller circuitry to have soft information of inherent threshold voltage values of the cell to be read (e.g., random access memory devices, programmable logic devices, non-volatile memory, volatile memory, FeRAM, CBRAM, PRAM, SONOS, RRAM, Racetrack memory, NRAM and Millipede storage devices). Such soft information can be further utilized in soft-decision error correction decoding. For example, the controller circuitry may require information on the inherent threshold voltage of a memory cell to correctly read the stored value in order to perform error correction on the stored values in the memory cell.

Figure 1:
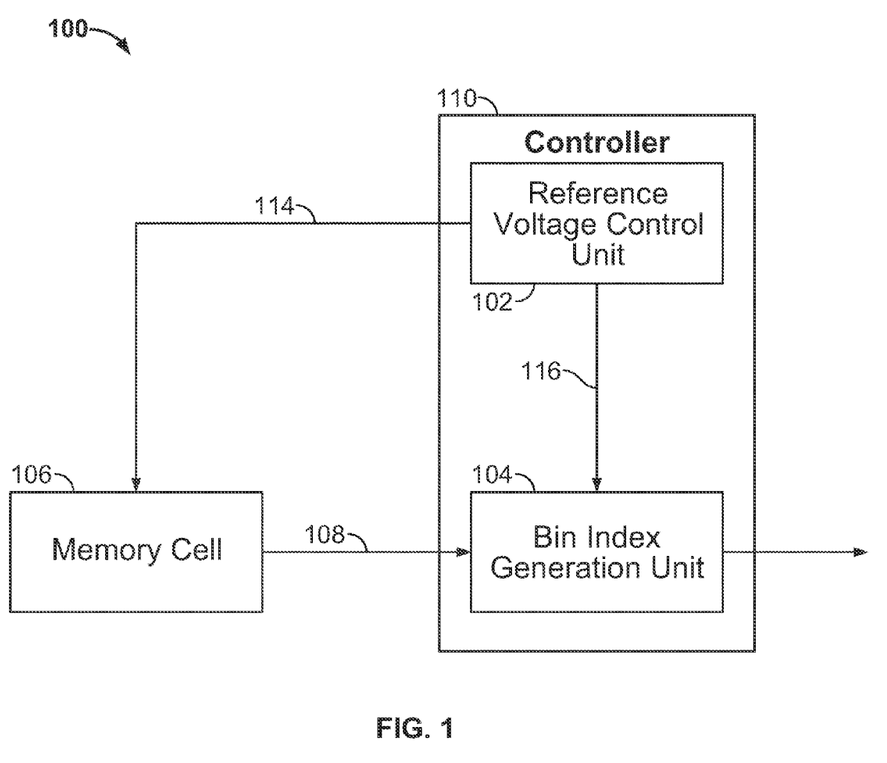
FIG. 1 shows an illustrative system that generates soft information of a memory cell in accordance with some embodiments of the present disclosure.

FIG. 1 shows an illustrative system 100 in accordance with some embodiments of the present disclosure. System 100 includes a reference voltage control unit 102, a bin index generation unit 104 and a flash memory cell 106. Reference voltage control unit 102 and bin index generation unit 104 may collectively be a controller 110. Memory cell 106 may include an electronic storage device (e.g., flash memory device, random access memory device, programmable logic device, non-volatile memory, volatile memory, FeRAM, CBRAM, PRAM, SONOS, RRAM, Racetrack memory, NRAM and Millipede storage devices).

In some embodiments, memory cell 106 may be one memory cell. In other embodiments, memory cell 106 may be more than one memory cell, used individually or in combination, and used in series or in parallel. Memory cell 106 may store a bit by storing different amounts of charge and therefore different memory cells may exhibit different amounts of threshold voltage. Accordingly, different memory cells storing the same bit may have different inherent threshold voltage values due to noise. These memory cells may form a distribution of threshold voltage values instead of having a fixed voltage value for each cell. It is therefore useful to be able to know where in the distribution of threshold voltage values a particular memory cell's threshold voltage lies in order to correctly and efficiently read the stored bit. Controller 110 reads the stored bit by applying a reference signal to the memory cell. In an embodiment, depending on whether the threshold voltage is higher or lower than the reference voltage, a transistor in the memory cell is turned on or off. This allows the stored bits to be detected.

In certain embodiments, reference voltage control unit 102 issues a read command to the memory cell by applying a reference signal 114 to memory cell 106. In an embodiment, reference voltage control unit 102 may be configured to periodically send reference signals to memory cell 106.

In another embodiment, reference voltage control unit 102 may send a predetermined number of reference signals to memory cell 106. In response to the applied reference signal 114, memory cell 106 outputs stored value 108 in the memory cell 106, hereinafter referred to as the hard decision bit, to the bin index generation unit 104. The hard decision bit may simply be a binary value to indicate whether the memory cell contains a 0 or a 1 stored for the bit being read.

In several embodiments, reference voltage control unit 102 transmits position information 116 for the applied reference signal 114 to bin index generation unit 104. Position information 116 may contain information on the voltage value of reference signal 114, the relative position of reference signal 114 with respect to any previously applied reference signals. In other embodiments, position information 116 may indicate the bin index of the bin associated with a range of voltages that includes the voltage of reference signal 114.

In one embodiment, memory cell 106 stores a single bit per cell. This embodiment of memory cell 106 is referred to as a single-level memory cell. In another embodiment, memory cell 106 stores more than one bit per cell and is referred to as a multi-level memory cell. For the purposes of this disclosure, the embodiments are discussed with reference to a multi-level cell that stores two bits per cell. However, any number of less or more bits may be stored in a memory cell and this disclosure is equally applicable to such cells.

Additional embodiments of FIG. 1 are described below in connection with FIG. 2.

Figure 2:
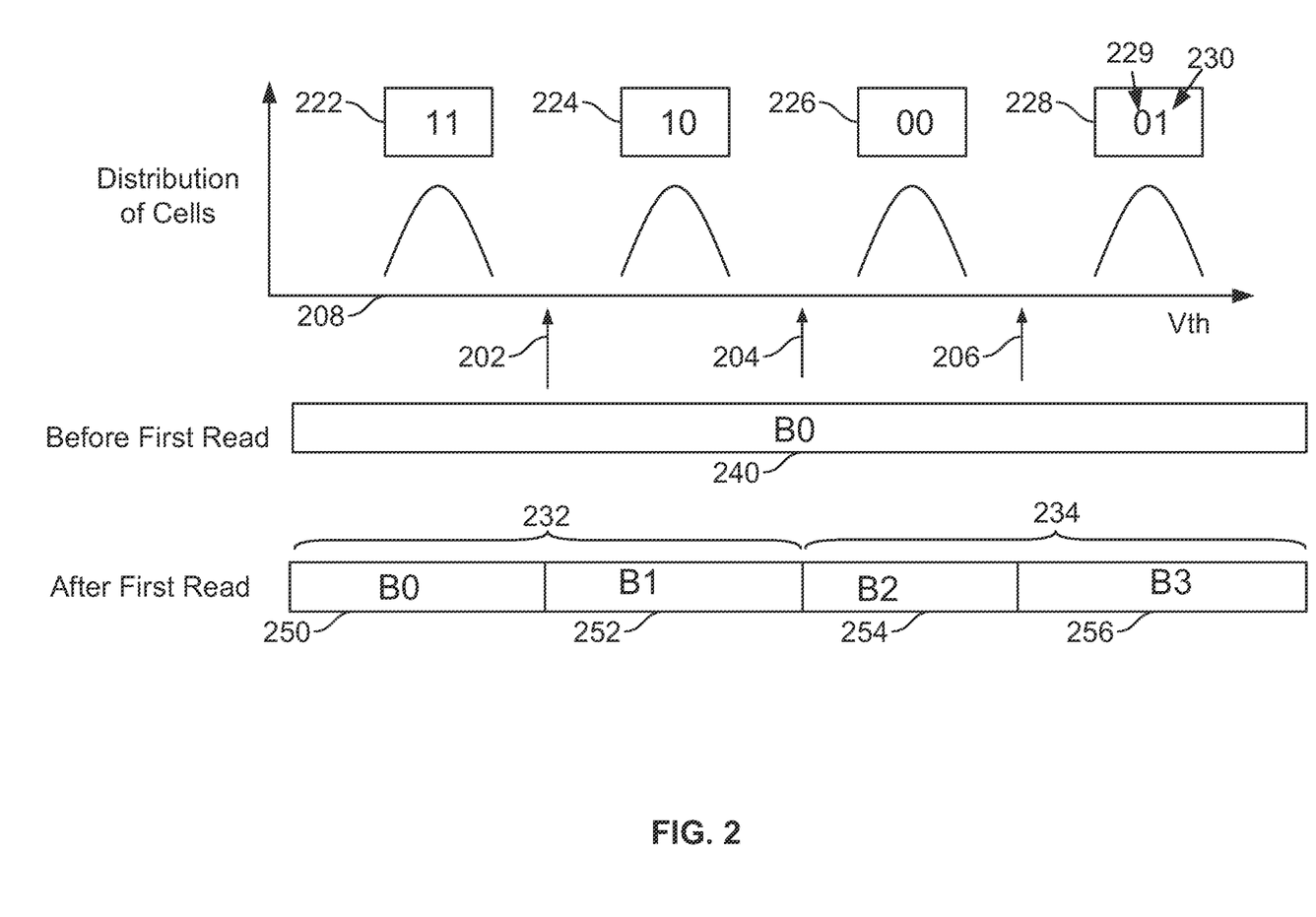
FIG. 2 shows an illustrative diagram depicting the relationship between indexed bins and threshold voltage values of a memory cell in accordance with several embodiments of the present disclosure.

FIG. 2 depicts the relationship between soft information and the stored bits in multi-level memory cells such as memory cell 106. FIG. 2 shows a graphical distribution of memory cells with respect to threshold voltages. The range of typical threshold voltage values 208 of a single memory cell 106 can be divided into subregions called bins. Bin index generation unit 104 performs the necessary computations to divide the range of typical voltage values 208 into bins. Bin index generation unit 104 uses reference signals 202, 204, and 206 to divide range 208 of threshold voltages of memory cell 106 into bins. A multi-level memory cell that stores two bits, the most significant bit and the least significant bit, can store four different unique combinations of bits. Stored bits 222, 224, 226, and 228 represent these four unique two bit combinations. As an example, stored bit combination 228 consists of most significant bit 229 and least significant bit 230. Each unique combination of a stored two bit value in memory cell 106 is associated with a particular portion of range 208 of threshold voltages. A plurality of bins may be associated with each portion of range 208 that corresponds to a particular two bit stored value in memory cell 106. Bin index generation unit 104 associates a bin with a stored memory bit, the details of which are discussed below in connection with FIG. 4B.

Only one reference signal 204 may be required to read the most significant bit of the two stored bits. Before a read operation is performed, bin index generation unit 104 assigns a default bin index to the entire range 208 of threshold voltage values. In the embodiment shown in FIG. 2, bin index generation unit 104 has assigns a bin index of 0 to the default bin 240, which corresponds to the entire range 208 of threshold voltage values. Reference signal 204 applied to memory cell 106 divides range 208 of threshold voltages into two subregions: subregion 232 and subregion 234. Bin index generation unit 104 splits range 208 into subregions 232 and 234 at the voltage value of reference signal 204. For example, bin index generation unit 104 identifies the voltage value of reference signal 204, which is transmitted to it by reference voltage control unit 102 as position information 116. Bin index generation unit 104 then divides range 208 into subregions 232 and 234 along the identified voltage of position information 116 for reference signal 204. Each of these two subregions is associated with a unique value of the most significant bit. For example, subregion 232 is associated with a bit value of 1 for the most significant bit. Similarly, subregion 234 is associated with a bit value of 0 for the most significant bit.

In order to read the least significant bit of the two-bit stored value in memory cell 106, at least two additional reference signals 202 and 206 are required. Reference signals 202 and 706 may be applied simultaneously to memory cell 106. Reference signal 202 and 206 each split subregions 232 and 234 into four subregions, each of which corresponds to a particular combination of the most significant stored bit and the least significant stored bit. For example, reference signal 202 splits subregion 232 into subregions 250 and 252. Reference signal 206 splits subregion 232 into subregions 254 and 256. Subregions 250, 252, 254, and 256 are the first four bins created after the first read operation performed on memory cell 106. Each of these bins corresponds to a particular combination of the most significant bit and the least significant bit of the two stored bits in the multi-level cell. Associating a memory cell with a given bin is equivalent to associating the threshold voltage of that particular memory cell with the associated bin's threshold voltage value range with a certain degree of probability. In addition, associating a memory cell with a given bin is also equivalent to associating the stored bits of that particular memory cell with a particular configuration of stored bits corresponding to the identified bin with a certain degree of probability.

Bin index generation unit 104 increases the number of bins used to represent the same range of threshold voltages with each additional read operation by identifying bin that corresponds to the reference signal and splitting the identified bin. Increasing the number of bins used to represent a given range of threshold voltages decreases the range of threshold voltage spanned by each bin, consequently increasing the resolution of the bins. As the bin resolution increases, the probability of determining the threshold voltage or the particular configuration of stored bits associated with that bin increases. Accordingly, the quality of the soft information generation improves as the bin resolution improves.

If memory cell 106 is a single-level cell, reference voltage control unit 102 applies one reference signal to memory cell 106 in one read operation to read the single stored bit in the single-level cell.

Output 108 of memory cell 106 to the applied reference signal may contain the stored bit in memory cell 106. Output 108 of memory cell 106 is transmitted to the bin index generation unit 104. Bin index generation unit 104 uses the measured output 108 to calculate soft information of the inherent threshold voltage value of memory cell 106.

Bin index generation unit 104 is configured to receive position information 116 of the reference signal generated by reference voltage control unit 102. Position information 116 for each reference signal 114 generated by the reference voltage control unit 102 is generated by reference voltage control unit 102 and transmitted to bin index generation unit 104.

Bin index generation unit 104 uses position information 116 in conjunction with output 108 of memory cell 106 to determine which bin a memory cell's threshold voltage belongs to. For example, bin index generation unit 104 determines the binary value of the hard decision bit and accordingly associates memory cell 106 with one of the split bins that is associated with the binary value of the hard decision bit. By associating memory cell 106 with a bin, bin index generation unit 104 effectively associates the threshold voltage of memory cell 106 with the voltage range spanned by that bin.

By determining which bin a particular memory cell can be associated with, the threshold value of the memory cell and the stored value of the memory cell may be determined with a certain degree of probability.

Position information 116 of reference signal 114 refers to the position of the reference signal 114 in the range of threshold voltage values. Position information 116 may contain information identifying which bin corresponds to the reference signal's voltage value. Information identifying which bin corresponds to the reference signal's voltage value is used by the bin index generation unit 104 to determine which bin to split into two bins based on the reference signal 114.

Increasing the number of read commands applied to the memory cell, with the voltage of the reference signal adjusted in each read operation, increases the resolution of the bins. Such a method of applying reference signals to memory cell 106 with different voltage values is herein referred to as progressive read. By receiving output 108 from memory cell 106 to each applied reference signal 114, bin index generation unit is better able to determine which bin the memory cell 106 belongs to.

As bin index generation unit 104 receives position information 116 of each reference signal with a new voltage value, bin index generation unit 104 determines which bin needs to be split. This determination is made by the bin index generation unit 104 based on the relative position of the reference signal 114 with reference to the previous bins. Upon determining which bin the applied reference signal 114 corresponds to, the bin index generation unit 104 splits that determined bin based on the absolute value of the reference signal 114. Therefore, the determined bin is split into two bins and the splitting boundary is the absolute voltage value of the reference signal 114. Bin index generation circuit 104 may also associate each of the newly created bins with a binary value corresponding to a stored bit in the memory cell. Based on the value of memory cell output 108 to applied reference signal 114, bin index generation unit 104 determines which one of the two newly created bins the memory cell's threshold voltage lies in. For instance, bin index generation unit 104 determines the binary value of output 108. Bin index generation unit 104 associates the memory cell with the newly created bin associated with a stored memory bit value that matches the binary value of output 108.

Bin index generation unit may also assign every single bin a bin index after each read operation in a multi-pass read. Accordingly, an inconsistent readout of memory cell 106 does not affect the soft generation process since the index of a bin that is not split is also updated regardless of the output of the memory cell to a reference signal.

Figure 3A:
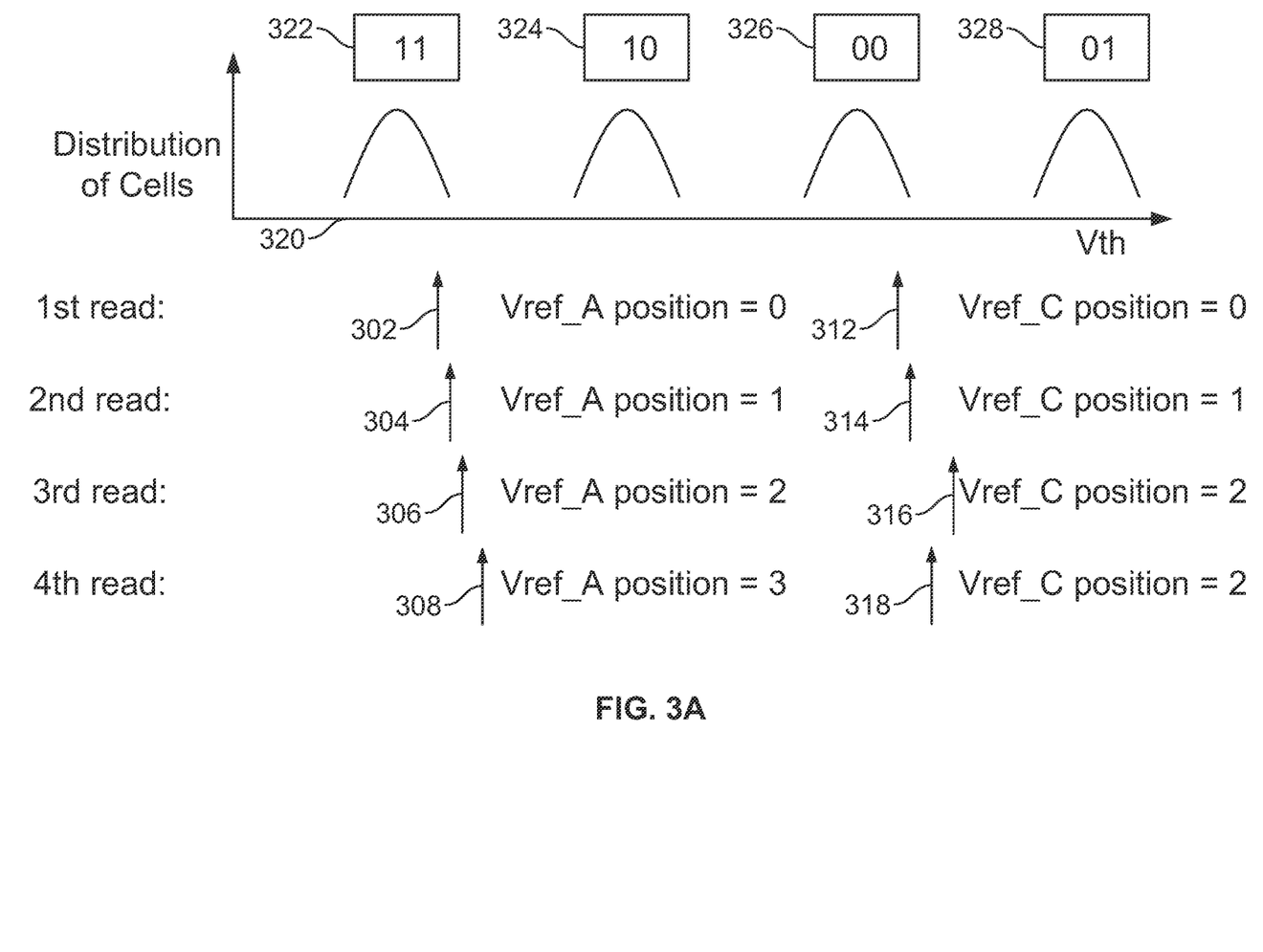
FIG. 3A shows an illustrative diagram in which a reference signal is shown to have knowledge of its relative position with respect to previous reference signals applied to the memory cell in accordance with an embodiment of the present disclosure.

FIG. 3A shows an example of a method in which position information 116 of a reference signal 114 is arranged according to an embodiment of the present disclosure. Position information 116 of a reference signal contains information on the relative position of the currently applied reference signal with respect to all the previously applied reference signals.

The example shown in FIG. 3A is that of a multi-level cell with two stored bits. Four different read operations are performed in succession in the progressive read sequence depicted to read the least significant stored bit of the two bits stored in memory cell 106. During every read operation depicted in FIG. 3A, two reference signals are applied to memory cell 106. The first set of reference signals 302, 304, 306 and 308 are labeled Vref_A and the second set of reference signals 312, 314, 316 and 318 are labeled Vref_C. Subregions 322, 324, 326, and 328 divide range 320 of all threshold voltages into subregions in which a memory cell with a particular combination of most significant and least significant bit of the two stored bits in the memory cell depicted in the subregion may lie. Subregions 322, 324, 326, and 328 are shown for illustrative purposes only. Each subregion may be associated with more than one bin.

During the first read operation, reference voltage control unit 102 applies reference signals 302 and 312 to memory cell 106. Reference signal 302 is the first issued reference signal of the first set of reference signals marked Vref_A. Reference signal 312 is the first issued reference signal of the second set of reference signals marked Vref_C. Accordingly, reference voltage control unit 102 sets the position value of reference signal 302 and 312 to 0 since reference signals 302 and 312 are the first reference signals in each of their respective set. During the second read in the progressive read sequence depicted, reference voltage control unit applies reference signals 304 and 314 to memory cell 106. Reference voltage control unit 102 determines that reference signal 304 has a higher voltage value than the previously applied reference signal 302 in the Vref_A set of signals and accordingly sets the position value of reference signal 304 to 1. Similarly, reference voltage control unit 102 determines that reference signal 314 has a higher voltage value than the previously applied reference signal 312 in the Vref_C set of signals and accordingly sets the position value of reference signal 314 to 1. During the third read in the progressive read sequence depicted, reference voltage control unit applies reference signals 306 and 316 to memory cell 106. Reference voltage control unit 102 determines that reference signal 206 has a higher voltage value than the previously applied reference signals 302 and 304 in the Vref_A set of signals and accordingly sets the position value of reference signal 306 to 2. Similarly, reference voltage control unit 102 determines that reference signal 316 has a higher voltage value than the previously applied reference signals 312 and 314 in the Vref_C set of signals and accordingly sets the position value of reference signal 316 to 2. During the fourth read in the progressive read sequence depicted, reference voltage control unit applies reference signals 308 and 318 to memory cell 106. Reference voltage control unit 102 determines that reference signal 308 has a higher voltage value than the previously applied reference signals 302, 304 and 306 in the Vref_A set of signals and accordingly sets the position value of reference signal 304 to 3. Reference voltage control unit 102 determines that reference signal 318 has a higher voltage value than the previously applied reference signal 312 and 314 but a lower voltage value than the previously applied reference signal 316 in the Vref_C set of signals and accordingly sets the position value of reference signal 318 to 2 since it has the third highest voltage value of all of the applied reference signals in the Vref_C set of signals. In this manner, reference voltage control unit 102 is able to properly account for the relative position of the applied reference signals even for reference signals that are applied out of a typical monotonically increasing or monotonically decreasing order. Therefore, the risk of corruption of the bin index generation process due to improper indexing of the relative position of the applied reference signal is minimized.

Figure 3B:
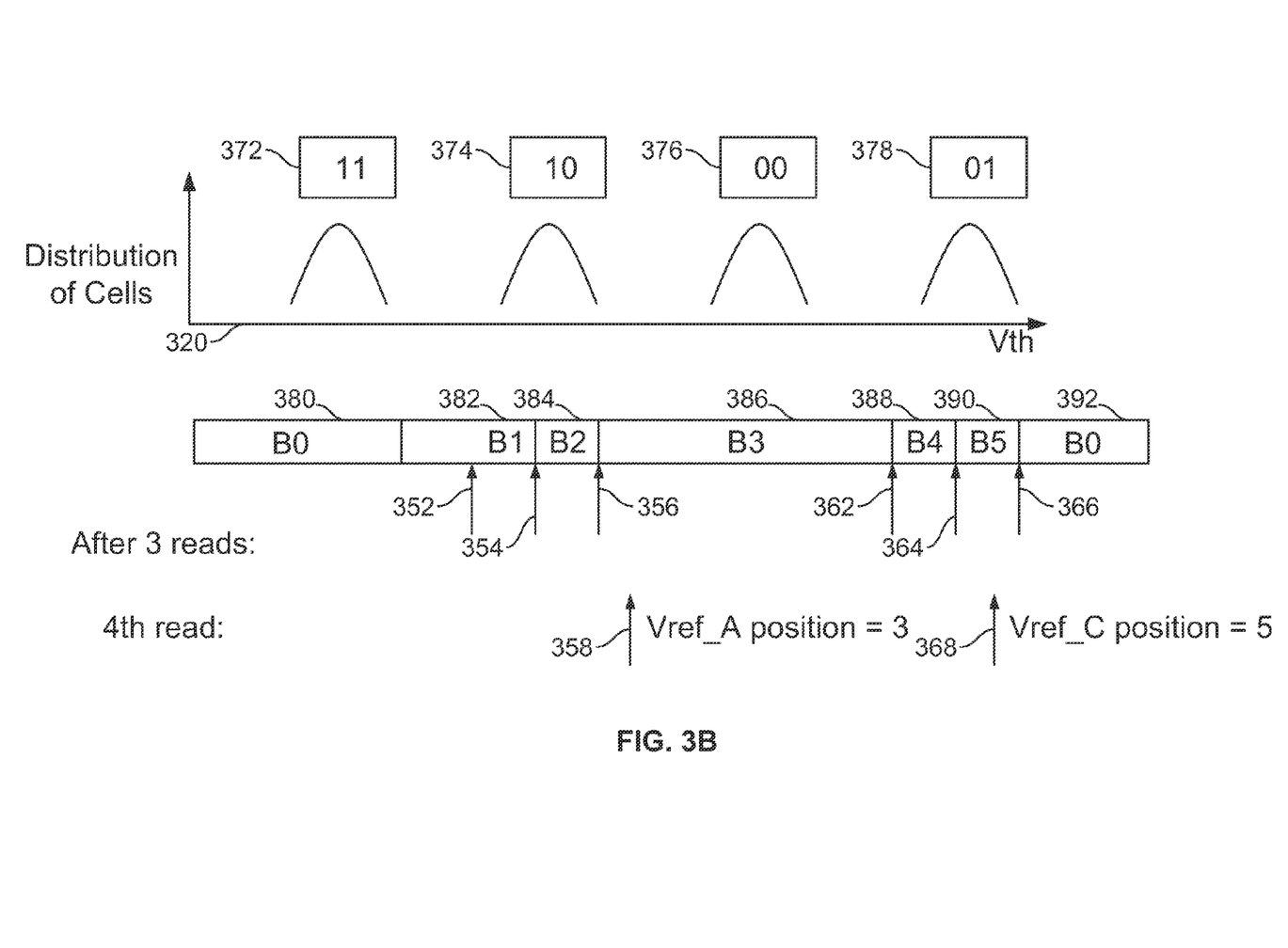
FIG. 3B shows an illustrative diagram in which a reference signal is shown to have knowledge of its voltage value with respect to a pre-existing bin in accordance with an embodiment of the present disclosure.

FIG. 3B shows an example of another method in which position information 116 of a reference signal 114 is arranged according to an embodiment of the present disclosure. Position information 116 of a reference signal contains information on which bin the reference signal corresponds to. In particular, reference voltage control unit 102 assigns a bin index to each applied reference signal 114. This bin index is assigned based upon knowledge of which currently existing bin includes the voltage value of the reference signal that is to be applied to memory cell 106.

The example shown in FIG. 3B is that of a multi-level cell with two stored bits. Four different read operations are performed in succession in the progressive read sequence depicted to read the least significant stored bit of the two bits stored in memory cell 106. During every read operation depicted in FIG. 3B, two reference signals are applied to memory cell 106. The first set of reference signals 352, 354, 356 and 358 are part of the Vref_A set of reference signals and the second set of reference signals 362, 364, 366 and 368 are part of Vref_C set of signals. Subregions 372, 374, 376, and 378 divide range 370 of all threshold voltages into subregions in which a memory cell with a particular combination of most significant and least significant bit of the two stored bits in the memory cell depicted in the subregion may lie. Subregions 372, 374, 376, and 378 are shown for illustrative purposes only. Each subregion may be associated with more than one bin.

FIG. 3B depicts the bins that have been created after system 100 has undergone three successive read operations. Bin index generation unit 104 updates reference voltage control unit 102 with information related to the range of threshold voltages that are associated with each bin index after every successive read operation in a progressive read sequence.

In the embodiment shown in FIG. 3B, bins 380, 382, 384, 386, 388, 390, and 392 divide the range of all threshold voltages after three read operations nave been performed. Reference voltage control unit 102 applies reference signals 358 and 368 to memory cell 106. At the same time, reference voltage control unit 102 transmits position information 116 for each of these applied reference signals to bin index generation unit 104. Position information 116 for each of these applied reference signals contains a bin index corresponding to an existing bin that spans a range of voltages including the voltage of the currently applied reference voltage by the reference voltage control unit 102. For instance, reference voltage control unit 102 determines that the voltage of reference signal 358 lies in the range of voltages spanned by bin 386 (labeled B3). Bin 386 has a bin index value of 3. The detailed process by which bin indices are assigned to bins is described below in connection with FIGS. 4A and 4B. Accordingly, reference voltage control unit 102 sets the position of reference signal 358 to 3. Similarly, reference voltage control unit 102 determines that the voltage of reference signal 318 lies in the range of voltages spanned by bin 390 (labeled B5). Bin 390 has a bin index value of 5. Accordingly, reference voltage control unit 102 sets the position of reference signal 368 to 5. Bin index generation unit 104 may also create a wraparound bin to mark the boundary between bin 390 and voltage values that are beyond the typical range of threshold voltage values of memory cell 106. Bin 392 is such a wraparound bin.

Figure 4A:
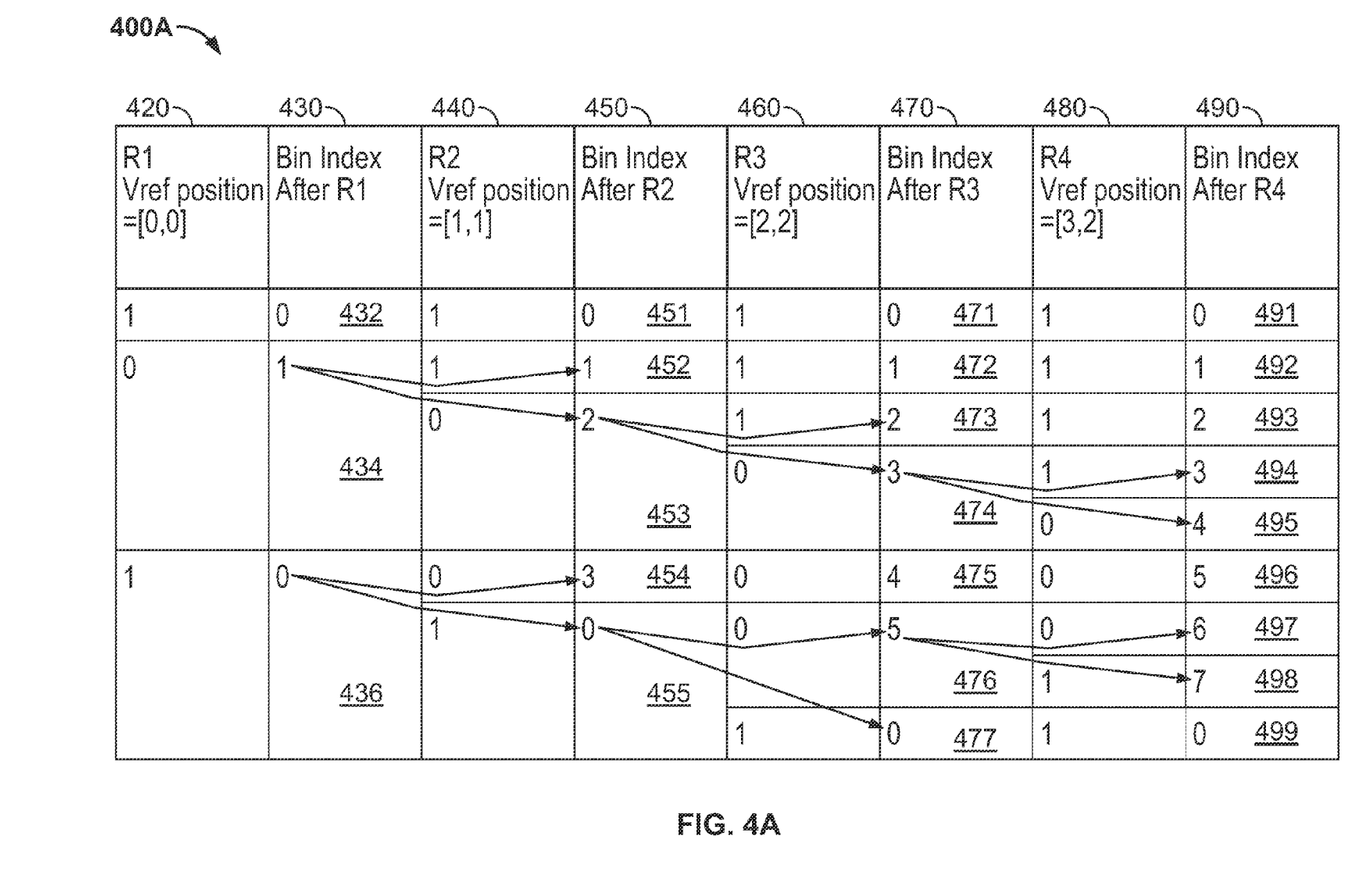
FIG. 4A shows an illustrative chart for depicting a process for increasing bin index resolution to improve the soft information generation process in accordance with various embodiments of the present disclosure.
Figure 4B:
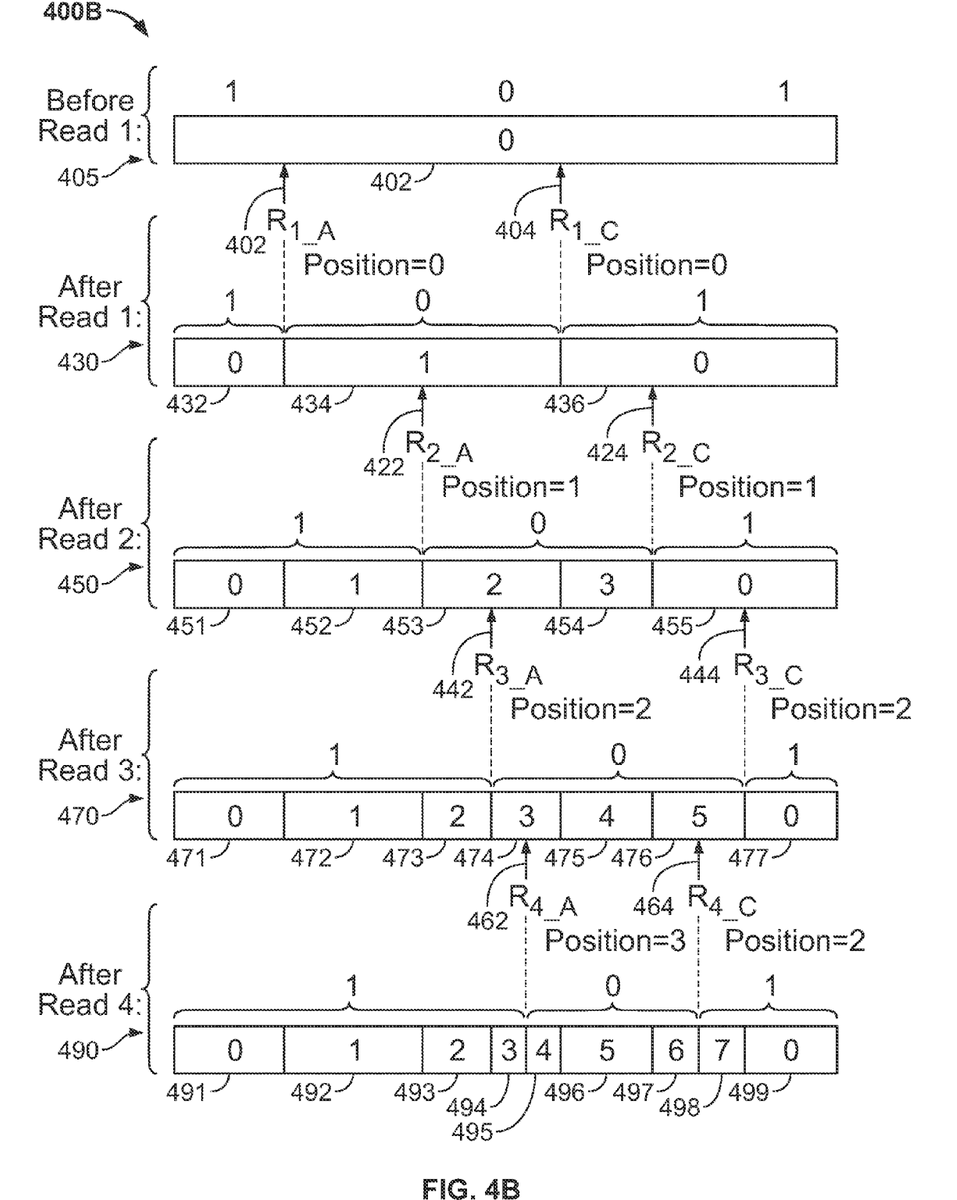
FIG. 4B shows an illustrative diagram depicting the process for increasing bin index resolution to improve the soft information generation process in accordance with various embodiments of the present disclosure.

FIGS. 4A and 4B illustrate the process of bin index generation in greater detail. FIG. 4A shows a table 400A delineating the bin index generation process wherein the entries of table 400A are the bin indexes of the generated bins after a particular read operation in a progressive read sequence with at least four reads. The embodiment of FIG. 2 in which the position information 116 of a reference signal is the relative position with relation to all the previously applied reference signals by the reference voltage control unit 102 is used in the example shown in FIG. 4A and FIG 4B. FIG. 4B illustrates the same process of bin index generation as FIG. 4A.

Table 400A depicts the bin indexes generated after the first read operation in column 430. Column 450 contains the bin indexes generated after the second read operation. Column 470 contains the bin indexes generated after the third read operation. Column 490 contains the bin indexes generated after the fourth read operation. Column 420 contains the hard decision bits from memory cell 106 after the first read operation as a result of applying reference signals 402 and 404 to memory cell 106 during the first read operation. Column 440 contains the hard decision bits from memory cell 106 after the second read operation as a result of applying reference signals 422 and 424 to memory cell 106 during the second read operation. Column 460 contains the hard decision bits from memory cell 106 after the third read operation as a result of applying reference signals 442 and 444 to memory cell 106 during the third read operation. Column 480 contains the hard decision bits from memory cell 106 after the fourth read operation as a result of applying reference signals 462 and 464 to memory cell 106 during the fourth read operation.

FIG. 4B shows a visual representation of the bins created after each read operation. Portion 405 shows that the range of threshold voltages only contains a single bin, bin 401, with a bin index of 0 before the first read operation has occurred. Bin index generation unit 104 assigns a default bin index of 0 to the entire range of threshold voltages if no read operations have been performed. Portion 430 shows the bins generated after the first read operation. Portion 450 shows the bins generated after the second read operation. Portion 470 shows the bins generated after the third read operation. Portion 490 shows the bins generated after the fourth read operation.

Bin index generation unit 104 also contains a sense of mapping of the stored memory bit values. For instance, portion 405 shows that before the first read, bin index generation unit has information that the range of threshold voltages in portion 405 will be associated with least significant bit values of 1, 0, and 1. In the embodiment shown in FIG. 4B, least significant bit value of 1 is associated with the lower end of the threshold voltage range and a least significant bit value of 0 is associated with the higher end of the threshold voltage range. However, as depicted in FIG. 4B, the highest end of the threshold voltage range is associated with a least significant bit value of 1. The highest end of the threshold voltage range needs to have an upper bound. Once this upper bound of typical threshold voltage values is exceeded, bin index generation unit wraps around to restarting the range of threshold value range with the least significant bit value of 1. Therefore in the example depicted in FIGS. 4A and 4B, two sets of reference voltages applied to memory cell 106 help determine the upper and lower bounds of regions in the threshold voltage range associated with the least significant bit memory values of 0 and 1.

Reference voltage control unit 102 applies reference signals 402, the first reference signal of set V_RefA, and 404 the first reference signal of set V_RefC to memory cell 106. Accordingly, reference voltage control unit 102 sets the position of reference signals 402 and 404 to 0. Bin index generation unit 104 uses the position information of reference signals 402 and 404 to divide the lone bin 402 into three bins: bin 432, bin 434, and bin 436. Column 420 of Table 400A shows the value of output 108 from memory cell 106 as a result of receiving reference signals 402 and 404. After receiving the position information from the reference voltage control unit 102 and the memory output from memory cell 106, bin index generation unit 104 identifies which bins will be split to generate new bins. In the first read operation 405, bin index generation unit 104 identifies that bin 402 will be split into two additional bins based on the received position information of reference signals 402 and 404. Bin index generation unit 104 uses position information of reference signals 402 and 404 and the corresponding memory output from memory cell 106 in response to applied reference signals to generate the bin index value of the newly split bins 432, 434 and 436. Bin index generation unit uses position information of reference signal 402 to determine the voltage value along which the old bin 402 will be split to create bins 432 and 434. Similarly, bin index generation unit uses position information of reference signal 404 to determine the voltage value along which the old bin 402 will be split to create bins 434 and 436. Bin index generation unit 104 then determines that a hard decision bit of 1 resulted from applying reference signal 402 to memory cell 106. As a result, bin index generation unit 104 associates memory cell 106 with bin 432. Since bin 432 is the leftmost bin of the threshold value range, bin index generation unit 104 automatically associates bin 432 with a stored least significant bit value of 1. Similarly, bin index generation unit 104 determines that a hard decision bit of 1 resulted from applying reference signal 404 to memory cell 106. As a result, bin index generation unit 104 associates memory cell 106 with bin 436. Since bin 436 is the rightmost bin of the threshold value range, bin index generation unit 104 automatically associates bin 436 with a stored least significant bit value of 1. Bin 436 is functionally equivalent to bin 432. The boundary between bin 434 and bin 436 marks the edge of the range of threshold voltage values. Bin index generation unit 104 assigns the newly created bins 432, 434, and 436 bin index values of 0, 1, and 0, respectively. Bin 432 is assigned a bin index of 0 since it is associated with the lowest range of threshold voltages. Bin 434 is associated a bin index of 1 since it spans a range of higher threshold voltages than bin 0. Bin 436 is assigned a bin index of 0 because it contains the highest range of threshold voltages and marks the boundary beyond the range of threshold voltages.

During the second read operation, reference voltage control unit 102 applies reference signal 422, the second reference signal in the V_RefA set with the highest voltage value, and reference signal 424, the second reference signal in the V_RefC set with the highest voltage value to memory cell 106. Reference voltage control unit 102 transmits the position information for reference signals 422 and 424 to bin index generation unit 104. Accordingly, reference voltage control unit sets the position of both reference signals 402 and 404 to 1.

Upon receiving output from memory cell 106 and the position information of reference signals 422 and 424, bin index generation unit 104 determines that reference signal 422 will split bin 434 and that reference signal 424 will split bin 436. In response to determining that reference signal 422 will split bin 434, bin index generation unit 104 splits bin 434 into bins 452 and 453 along the voltage value of reference signal 422. Bin index generation unit 104 uses position information of reference signal 422 and the corresponding memory output from memory cell 106 in response to applied reference signal 422 to generate the bin index value of the newly split bins 452, 453. The voltage value of reference signal 422 is contained in the position information that bin index generation unit 104 receives from reference voltage control unit 102. Bin index generation unit 104 determines that a hard decision bit of 1 resulted from applying reference signal 422 to memory cell 106. As a result, bin index generation unit 104 associates memory cell 106 with bin 452. Since bin 452 is associated with memory cell 106's threshold voltage estimate, bin index generation unit 104 associates bin 452 with a stored least significant bit value of 1. Bin index generation unit 104 associates bin 453, the other bin created from splitting old bin 434, with a stored least significant bit value of 0. Bin index generation unit 104 assigns the newly created bins 452 and 453 bin index values of 1 and 2, respectively. Bin 452 is assigned a bin index of 1 since it is the bin with the second lowest threshold voltage range. Bin 453 is assigned a bin index of 2 since it spans a range of threshold voltages just higher than bin 1.

Similarly, in response to determining that reference signal 424 will split bin 436, bin index generation unit 104 splits bin 436 into bins 454 and 455 along the voltage value of reference signal 424. Bin index generation unit 104 uses position information of reference signal 424 and the corresponding memory output from memory cell 106 in response to applied reference signal 424 to generate the bin index value of the newly split bins 454, 455. The voltage value of reference signal 424 is contained in the position information that bin index generation unit 104 receives from reference voltage control unit 102. Bin index generation unit 104 determines that a hard decision bit of 1 resulted from applying reference signal 424 to memory cell 106. As a result, bin index generation unit 104 associates memory cell 106 with bin 455. Since bin 455 is the rightmost bin of the threshold value range, bin index generation unit 104 automatically associates bin 455 with a stored least significant bit value of 1. Bin index generation unit 104 associates bin 454, the other bin created from splitting old bin 436, with a stored least significant bit value of 0 since it is determined to have a lower range of threshold voltages than bin 455, the wraparound bin. The boundary between bin 454 and bin 455 marks the edge of the range of threshold voltage values. Bin index generation unit 104 assigns the newly created bins 454 and 455 bin index values of 3 and 0, respectively. Bin index generation unit 104 assigns bin 454 a bin index of 3 since it spans a range of threshold voltages just higher than bin 2. Bin index generation unit 104 assigns bin 436 a bin index of 0 because it contains the highest range of threshold voltages and marks the boundary beyond the range of threshold voltages.

In addition to assigning bin index values to the newly split bins 452-455, bin index generation unit 104 also determines that old bin 432 was not split. Bin index generation control unit 104 also updates the bin index of old bin 432. Updating the unsplit bin's bin index may or may not actually change the bin index of that bin. For example even after bin index generation unit updated the bin index of old bin 432 to that of the new bin 451, the actual bin index still remained unchanged with a bin index of 0. Bin index generation unit 104 determined that bin 451 is the leftmost bin with the lowest range of threshold voltages and accordingly assigned it a bin index of 0.

The two bins at the two ends of the threshold voltage value spectrum may be assigned the same bin index value. In the example depicted in FIG. 4A and FIG. 4B, that bin index value is 0 assigned to bins 451 and 455.

During the third read operation, reference voltage control unit 102 applies reference signal 442, the third reference signal in the V_RefA set with the highest voltage value, and reference signal 424, the third reference signal in the V_RefC set with the highest voltage value to memory cell 106. Reference voltage control unit 102 transmits the position information for reference signals 442 and 444 to bin index generation unit 104. Accordingly, reference voltage control unit sets the position of both reference signals 402 and 404 to 2.

Upon receiving output from memory cell 106 and the position information of reference signals 442 and 444, bin index generation unit 104 determines that reference signal 442 will split bin 453 and that reference signal 444 will split bin 455. In response to determining that reference signal 442 will split bin 453, bin index generation unit 104 splits bin 453 into bins 473 and 474 along the voltage value of reference signal 442. Bin index generation unit 104 uses position information of reference signal 442 and the corresponding memory output from memory cell 106 in response to applied reference signal 442 to generate the bin index value of the newly split bins 473, 474. The voltage value of reference signal 442 is contained in the position information that bin index generation unit 104 receives from reference voltage control unit 102. Bin index generation unit 104 determines that a hard decision bit of 1 resulted from applying reference signal 442 to memory cell 106. As a result, bin index generation unit 104 associates memory cell 106 with bin 473. Since bin 473 is associated with memory cell 106's threshold voltage estimate, bin index generation unit 104 associates bin 473 with a stored least significant bit value of 1. Bin index generation unit 104 associates bin 474, the other bin created from splitting old bin 453, with a stored least significant bit value of 0. Bin index generation unit 104 assigns the newly created bins 473 and 474 bin index values of 2 and 3, respectively. Bin 473 is assigned a bin index of 2 since it is the bin with the third lowest threshold voltage range. Bin 474 is assigned a bin index of 3 since it spans a range of threshold voltages just higher than bin 2.

Similarly, in response to determining that reference signal 444 will split bin 455, bin index generation unit 104 splits bin 455 into bins 476 and 477 along the voltage value of reference signal 444. Bin index generation unit 104 uses position information of reference signal 444 and the corresponding memory output from memory cell 106 in response to applied reference signal 444 to generate the bin index value of the newly split bins 476 and 477. The voltage value of reference signal 444 is contained in the position information that bin index generation unit 104 receives from reference voltage control unit 102. Bin index generation unit 104 determines that a hard decision bit of 1 resulted from applying reference signal 444 to memory cell 106. As a result, bin index generation unit 104 associates memory cell 106 with bin 477. Since bin 477 is the rightmost bin of the threshold value range, bin index generation unit 104 automatically associates bin 477 with a stored least significant bit value of 1. Bin index generation unit 104 associates bin 476, the other bin created from splitting old bin 455, with a stored least significant bit value of 0 since it is determined to have a lower range of threshold voltages than bin 477, the wraparound bin. The boundary between bin 476 and bin 477 marks the edge of the range of threshold voltage values. Bin index generation unit 104 assigns the newly created bins 476 and 477 bin index values of 5 and 0, respectively. Bin index generation unit 104 assigns bin 476 a bin index of 5 since it is the sixth bin in an ordered set of bins with increasing threshold voltage ranges. Bin index generation unit 104 assigns bin 477 a bin index of 0 because it contains the highest range of threshold voltages and marks the boundary beyond the range of threshold voltages.

In addition to assigning bin index values to the newly split bins 473, 474, 476, and 477, bin index generation unit 104 also determines that old bins 451, 452 and 454 were not split. Bin index generation control unit 104 also updates the bin index of old bins 451, 452 and 454. Updating the unsplit bins' bin indexes may or may not actually change the bin index of that bin. For example, the bin index of old bin 451 is updated to have the same bin index value of 0 as bin 471 since bin index generation unit 104 determines that it still the bin with the lowest threshold voltage range. Similarly, the bin index of old bin 452 is updated to have the same bin index value of 1 as bin 472 since bin index generation unit 104 determines that it still the bin with the second lowest threshold voltage range. However, bin index generation unit updates old bin 454's bin index value of 3 to a bin index value of 4 as new bin 475. Bin index generation unit determines that bin 475 is now the fifth bin in an ordered set of bins with increasing threshold voltage ranges and accordingly assigns bin 475 a bin index of 4.

During the fourth read operation, reference voltage control unit 102 applies reference signal 462, the fourth reference signal in the V_RefA set with the highest voltage value in the V_RefA set to memory cell 106. Accordingly, reference voltage control unit sets the position of reference signals 462 to 3. In addition, reference voltage control unit 102 applies reference signal 464, the fourth reference signal in the V_RefC set to memory cell 106. Reference voltage control unit knows that the voltage of reference signal is greater than two other previously applied reference signals in the V_RefC set, namely reference signals 404 and 424 but less than the voltage value of previously applied reference signal 444. Accordingly, reference voltage control unit sets the position of reference signals 464 to 2 since it has the third highest voltage value in the V_RefC set of reference signals.

By keeping track of the relative position of the reference signal, bin index generation unit 104 is able to handle reference signals that may be applied out of order in a monotonically increasing or monotonically decreasing progressive read sequence in a multi-pass read.

Upon receiving output from memory cell 106 and the position information of reference signals 462 and 464, bin index generation unit 104 determines that reference signal 462 will split bin 474 and that reference signal 464 will split bin 476. In response to determining that reference signal 462 will split bin 474, bin index generation unit 104 splits bin 474 into bins 494 and 495 along the voltage value of reference signal 462. Bin index generation unit 104 uses position information of reference signal 462 and the corresponding memory output from memory cell 106 in response to applied reference signal 442 to generate the bin index value of the newly split bins 494, 495. The voltage value of reference signal 462 is contained in the position information that bin index generation unit 104 receives from reference voltage control unit 102. Bin index generation unit 104 determines that a hard decision bit of 1 resulted from applying reference signal 462 to memory cell 106. As a result, bin index generation unit 104 associates memory cell 106 with bin 494. Since bin 494 is associated with memory cell 106's threshold voltage estimate, bin index generation unit 104 associates bin 494 with a stored least significant bit value of 1. Bin index generation unit 104 associates bin 495, the other bin created from splitting old bin 474, with a stored least significant bit value of 0. Bin index generation unit 104 assigns the newly created bins 494 and 495 bin index values of 3 and 4, respectively. Bin 494 is assigned a bin index of 3 since it is the bin with the fourth lowest threshold voltage range. Bin 474 is assigned a bin index of 4 since it spans a range of threshold voltages just higher than bin 3.

Similarly, in response to determining that reference signal 464 will split bin 476, bin index generation unit 104 splits bin 476 into bins 497 and 493 along the voltage value of reference signal 464. Bin index generation unit 104 uses position information of reference signal 464 and the corresponding memory output from memory cell 106 in response to applied reference signal 464 to generate the bin index value of the newly split bins 497 and 498. The voltage value of reference signal 464 is contained in the position information that bin index generation unit 104 receives from reference voltage control unit 102. Bin index generation unit 104 determines that a hard decision bit of 1 resulted from applying reference signal 464 to memory cell 106. As a result, bin index generation unit 104 associates memory cell 106 with bin 498. Since bin 498 is associated with memory cell 106's threshold voltage estimate, bin index generation unit 104 associates bin 498 with a stored least significant bit value of 1. Bin index generation unit 104 associates each of the two newly split bins with a different least significant bit value. Hence, bin index generation unit 104 associates bin 497, the other bin created from splitting old bin 476, with a stored least significant bit value of 0 since it is the other bin split from old bin 476. Bin index generation unit 104 assigns the newly created bins 497 and 498 bin index values of 6 and 7, respectively. Bin index generation unit 104 assigns bin 497 a bin index of 6 since it is the seventh bin in an ordered set of bins with increasing threshold voltage ranges. Bin index generation unit 104 assigns bin 498 a bin index of 7 since it is the eighth bin in an ordered set of bins with increasing threshold voltage ranges.

In addition to assigning bin index values to the newly split bins 494, 495, 497, and 498, bin index generation unit 104 also determines that old bins 471, 472, 473, 475 and 477 were not split. Bin index generation control unit 104 updates the bin index of old bins 471, 472, 473, 475 and 477. Bin index of old bin 471 is updated to have the same bin index value of 0 as bin 491 since bin index generation unit 104 determines that bin 491 is the bin with the lowest threshold voltage range. Similarly, the bin index of old bin 472 is updated to nave the same bin index value of 1 as bin 492 since bin index generation unit 104 determines that bin 492 is the bin with the second lowest threshold voltage range. Similarly, the bin index of old bin 473 is updated to have the same bin index value of 2 as bin 493 since bin index generation unit 104 determines that bin 493 is the bin with the third lowest threshold voltage range. Similarly, the bin index of old bin 477 is updated to have the same bin index value of 0 as bin 499 since bin index generation unit 104 determines that bin 499 is the bin with the highest threshold voltage range. However, bin index generation unit updates old bin 475's bin index value of 4 to a bin index value of 5 as new bin 496. Bin index generation unit determines that bin 496 is now the sixth bin in an ordered set of bins with increasing threshold voltage ranges and accordingly assigns bin 496 a bin index of 5.

In this manner, bin index generation unit 104 divides the range of typical threshold voltages of memory cell 106 into a greater number of bins with each read operation. By increasing the number of bins in a set range of threshold voltage values, the range of voltages spanned by each bin decreases, thereby increasing bin resolution. By increasing bin resolution, bin index generation unit 104 also provides the controller 102 with a more accurate estimate of which regions of the threshold voltage range is associated with a given stored least significant bit value.

Figure 5:
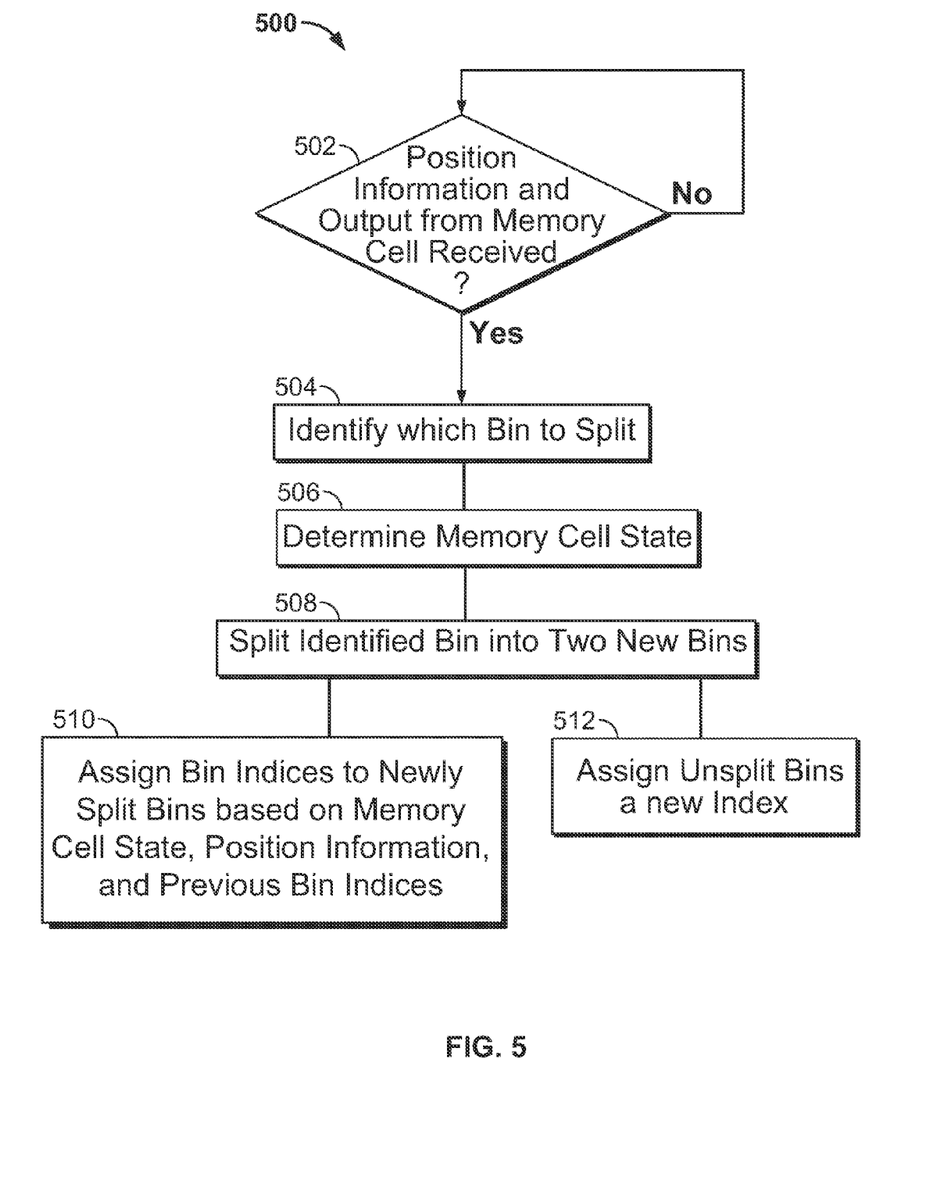
FIG. 5 shows an illustrative flow chart depicting a process for generating soft information in accordance with several embodiments of the present disclosure.
Figure 6:
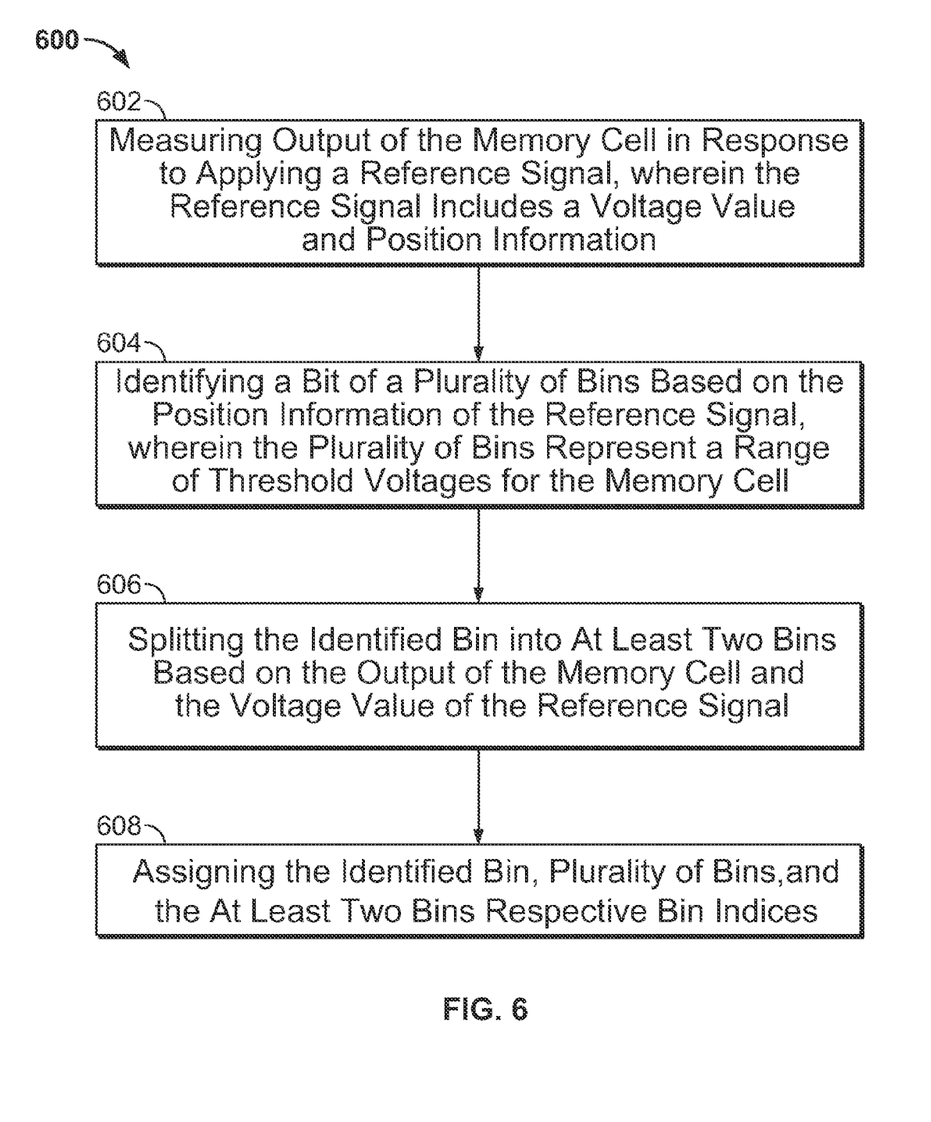
FIG. 6 shows another illustrative flow chart depicting a process for generating soft information in accordance with several embodiments of the present disclosure.

The following flow charts of FIGS. 5 and 6 serve to illustrate processes involved in some embodiments of the present disclosure during a single read operation. It should be understood that the operations of the flow charts are merely illustrative and any of the depicted operations may be modified, omitted, or rearranged, two or more of the operations may be combined, or any additional operations may be added, without departing from the scope of the invention. Also, some of the operations may be executed or performed substantially simultaneously where appropriate or in parallel to reduce latency and processing times.

FIG. 5 depicts the processes implemented by bin index generation unit 104 during a single read operation to increase bin resolution. At 502, bin index generation unit 104 determines whether it has received position information 116 from reference voltage control unit 102 and memory output 108 from memory cell 106. If bin index generation unit 104 has received both position information 116 from reference voltage control unit 102 and memory output 108 from memory cell 106, it will proceed to 504. If bin index generation unit 104 has not received both position information 116 from reference voltage control unit 102 and memory output 108 from memory cell 106, it will wait until it receives both position information 116 and memory output 108 until it proceeds further. At 504, bin index generation unit 504 identifies which existing bin it needs to split based on memory output 108 and position information 116 of the reference signal. At 506, bin index generation unit determines the state of memory cell 106. For instance, bin index generation unit 104 determines the binary value stored in the least significant bit of memory cell 106. At 508, bin index generation unit 104 splits the bin identified in 504 into two new bins. Bin index generation unit 104 splits the identified bin along the voltage value determined from the reference signal's position information 116. At 510, bin index generation unit assigns the newly split bins a new bin index based on the memory cell state, position information and any previously assigned bin indices. At 512, bin index generation unit 104 assigns the previously existing bins that were not split a new bin index. This bin index assigned to the unsplit bins may or may not be different from the bin index previously assigned to the unsplit bins.

FIG. 6 shows an illustrative flow chart depicting a process for generating soft information in accordance with several embodiments of the present disclosure. At 602, output 108 of memory cell 106 is measured. Memory cell 106 generates output 108 in response to a reference signal 114 issued by reference voltage control unit 110 to initiate a read operation. Reference signal 114 contains a voltage value and may also contain position information.

At 604, bin index generation unit 104 identifies a bin of a plurality of bins based on the position information of the reference signal 116. Reference signal 116 is transmitted from reference voltage control unit 102 to bin index generation unit 104. Reference signal 116 may be the same reference signal as reference signal 114.

At 606, bin index generation unit 104 splits the identified bin into at least two bins based on the measured output 108 of memory cell 106 and the voltage value of reference signal 114.

At 608, bin index generation unit 104 assigns an the identified bin to be split, the at least two bins that are split, and the plurality of bins mentioned above respective bin indices.

It is beneficial for flash controller 110 to possess soft information of the inherent threshold voltage value of memory cell 106. Knowledge of the threshold voltage value of memory cell 106 allows flash controller 110 to apply an appropriate reference voltage to properly store or read information in memory cell 106. Furthermore, such soft information may be utilized in soft decision error correction code decoding. For example, flash controller 110 will require information on the inherent threshold voltage of memory cell 106 to correctly read the stored value in memory cell 106 in order to perform error correction on the stored values in memory cell 106.

The foregoing is merely illustrative of the principles of this disclosure and various modifications can be made without departing from the scope of the present disclosure. The above described embodiments of the present disclosure are presented for purposes of illustration and not of limitation, and the present disclosure is limited only by the claims which follow.

What is claimed is:

1. A method for generating soft information for a memory cell, the method comprising:
   identifying a range of threshold voltages for the memory cell;
   applying a reference signal to the memory cell;
   measuring an output of the memory cell in response to applying the reference signal; and
   segmenting the range of threshold voltages based on the output of the memory cell and the reference signal.

2. The method of claim 1, wherein the reference signal comprises a voltage value and position information.

3. The method of claim 2, wherein the position information of the reference signal comprises a relative position of the reference signal with respect to a previously applied reference signal.

4. The method of claim 2, wherein the position information of the reference signal comprises a subset of the range of threshold voltages that includes the voltage value of the reference signal.

5. The method of claim 1, wherein segmenting the range of threshold voltages comprises splitting the range of threshold values into at least two bins.

6. The method of claim 5, further comprising assigning the range of threshold voltages and each of the at least two bins respective indices.

7. The method of claim 6, wherein each of the at least two bins are assigned an index based on the measured output of the memory cell.

8. The method of claim 1, further comprising transmitting the reference signal from a reference voltage control unit to a bin index generation unit.

9. The method of claim 1, wherein measuring the output of the memory cell comprises issuing a read command to the memory cell and reading a stored bit in the memory cell.

10. The method of claim 1, further comprising determining a boundary of the range of threshold voltages to be segmented based on a voltage value of the reference signal.

11. A system for generating soft information for a memory cell, the system comprising:
    circuitry configured to:
       identify a range of threshold voltages for the memory cell;
       apply a reference signal to the memory cell;
       measure an output of the memory cell in response to applying the reference signal; and
       segment the range of threshold voltages based on the output of the memory cell and the reference signal.

12. The system of claim 11, wherein the reference signal comprises a voltage value and position information.

13. The system of claim 12, wherein the position information of the reference signal comprises a relative position of the reference signal with respect to a previously applied reference signal.

14. The system of claim 12, wherein the position information of the reference signal comprises a subset of the range of threshold voltages that includes the voltage value of the reference signal.

15. The system of claim 11, wherein the range of threshold voltages is segmented by splitting the range of threshold values into at least two bins.

16. The system of claim 11, wherein the circuitry is further configured to assign the range of threshold voltages and each of the at least two bins respective indices.

17. The system of claim 16, wherein the at least two bins are assigned an index based on the measured output of the memory cell.

18. The system of claim 11, wherein the circuitry is further configured to transmit the reference signal from a reference voltage control unit to a bin index generation unit.

19. The system of claim 11, wherein the circuitry is further configured to:

issue a read command to the memory cell; and
read a stored bit in the memory cell.

20. The system of claim 11, wherein the circuitry is further configured to determine a boundary of the range of threshold voltages to be segmented based on a voltage value of the reference signal.

* * * * *